(12) United States Patent
Mochida

(10) Patent No.: US 6,337,579 B1
(45) Date of Patent: Jan. 8, 2002

(54) MULTICHIP SEMICONDUCTOR DEVICE

(75) Inventor: Hiroo Mochida, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/517,283

(22) Filed: Mar. 2, 2000

(30) Foreign Application Priority Data

Mar. 5, 1999 (JP) .......................................... 11-058078

(51) Int. Cl.[7] .......................................... H03K 19/177
(52) U.S. Cl. ............................ 326/41; 326/39; 326/40; 326/101
(58) Field of Search ............................. 326/38, 40, 41, 326/101

(56) References Cited

U.S. PATENT DOCUMENTS

| | | | | |
|---|---|---|---|---|
| 4,697,095 A | * | 9/1987 | Fujii | 327/408 |
| 5,440,423 A | * | 8/1995 | Cooke et al. | 361/790 |
| 5,640,107 A | * | 6/1997 | Kruse | 326/38 |
| 5,801,547 A | * | 9/1998 | Kean | 326/40 |
| 5,977,640 A | * | 11/1999 | Bertin et al. | 257/777 |
| 6,049,222 A | * | 4/2000 | Lawman | 326/38 |

FOREIGN PATENT DOCUMENTS

| | | | | |
|---|---|---|---|---|
| JP | 05013663 A | * | 1/1993 | 257/777 |
| JP | 05167004 A | * | 7/1993 | 257/929 |

* cited by examiner

Primary Examiner—Michael Tokar
Assistant Examiner—Steven S. Paik
(74) Attorney, Agent, or Firm—Arent Fox Kintner Plotkin & Kahn PLLC

(57) ABSTRACT

A multichip semiconductor device has a first semiconductor chip and a second semiconductor chip superposed on and bonded to each other so as to form a chip-on-chip structure. The first semiconductor chip has a field-programmable gate array circuit and a switch circuit formed thereon. The second semiconductor chip has a non-volatile configuration memory circuit formed thereon for storing the setting information about how to set the circuit of the field-programmable gate array circuit.

2 Claims, 5 Drawing Sheets

US 6,337,579 B1

MULTICHIP SEMICONDUCTOR DEVICE

BACKGROUND OF THE INVENTION

1. Field of the Invention

The present invention relates to a multichip semiconductor device having a field-programmable gate array.

2. Description of the Prior Art

FPGAs (field-programmable gate arrays) allow their users to program desired circuits, and are thus often used in particular when a variety of products are manufactured in small quantities. As shown in FIG. 5, a conventional FPGA is built as an FPGA chip 100 having a programmable gate array 101 and an SRAM (static RAM) 102 for setting the states of the switches thereof integrated together by a CMOS process. This FPGA chip 100 is enclosed in an IC package, and an EPROM 110 is externally connected thereto. By writing to this EPROM 110 the setting information about how to set the states of the switches of the programmable gate array 101, it is possible to obtain a desired circuit.

In general, an FPGA chip 100 and an EPROM 110 are enclosed in separate IC packages, and they are connected together through a printed circuit board.

However, in this structure, the FPGA chip 100 needs to be provided with connection pads for achieving connection to the EPROM 110, and, quite inconveniently, this requires an accordingly large chip area or sets a limit on the number of input/output signals allowed into and out of the programmable gate array 101.

This can be overcome by integrating an FPGA and an EPROM together on a single chip. However, forming a gate array and an EPROM on a common chip requires an extremely complicated process and leads to a steep rise in manufacturing cost. Thus, this is not a desirable solution.

Moreover, once electronic apparatuses having an FPGA and an EPROM integrated together on a single chip become widely available on the market, it is easy for a third party to read the contents of the EPROM. Quite inconveniently, this endangers the secrecy of the information stored in the EPROM.

SUMMARY OF THE INVENTION

An object of the present invention is to provide a multichip semiconductor device having a field-programmable gate array but nevertheless provided with a minimum number of external connection terminals.

Another object of the present invention is to provide a multichip semiconductor device having a field-programmable gate array but nevertheless capable of ensuring the secrecy of the setting information stored therein with satisfactory reliability.

To achieve the above objects, according to the present invention, a multichip semiconductor device is provided with: a first semiconductor chip having a field-programmable gate array; a second semiconductor chip having a programmable non-volatile memory for storing setting information about how to set the circuit of the field-programmable gate array; and a first connecting member for connecting the field-programmable gate array and the non-volatile memory to each other.

In this structure, the setting information about the field-programmable gate array formed on a first semiconductor chip is stored in the non-volatile memory formed in a second semiconductor chip, and these first and second semiconductor chips are connected to each other by a chip-to-chip connection member. The first and second semiconductor chips are, for example, enclosed in a common package so as to form a multichip semiconductor device. This makes it possible to eliminate external connection terminals for setting the circuit of the field-programmable gate array, and thus helps reduce the total number of external connection terminals required, alleviating the limit on the number of input/output signals allowed into and out of the field-programmable gate array. Moreover, since the field-programmable gate array and the non-volatile memory are formed on separate chips, it is not necessary to use a complicated manufacturing process.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, embodiments of the present invention will be described with reference to the accompanying drawings.

<First Embodiment>

Figure 1:
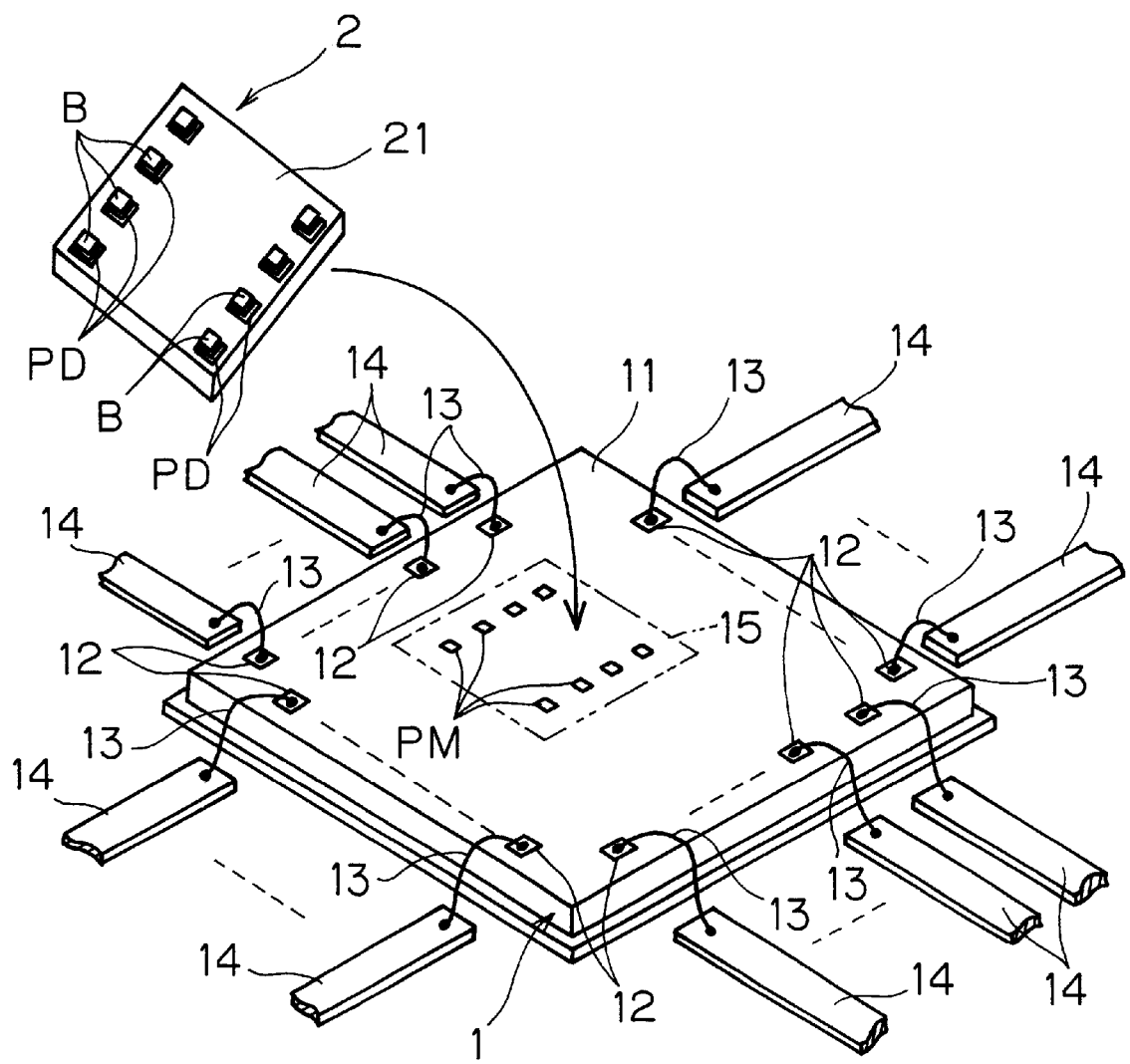
FIG. 1 is an exploded perspective view of a multichip semiconductor device of a first embodiment of the invention.
Figure 2:
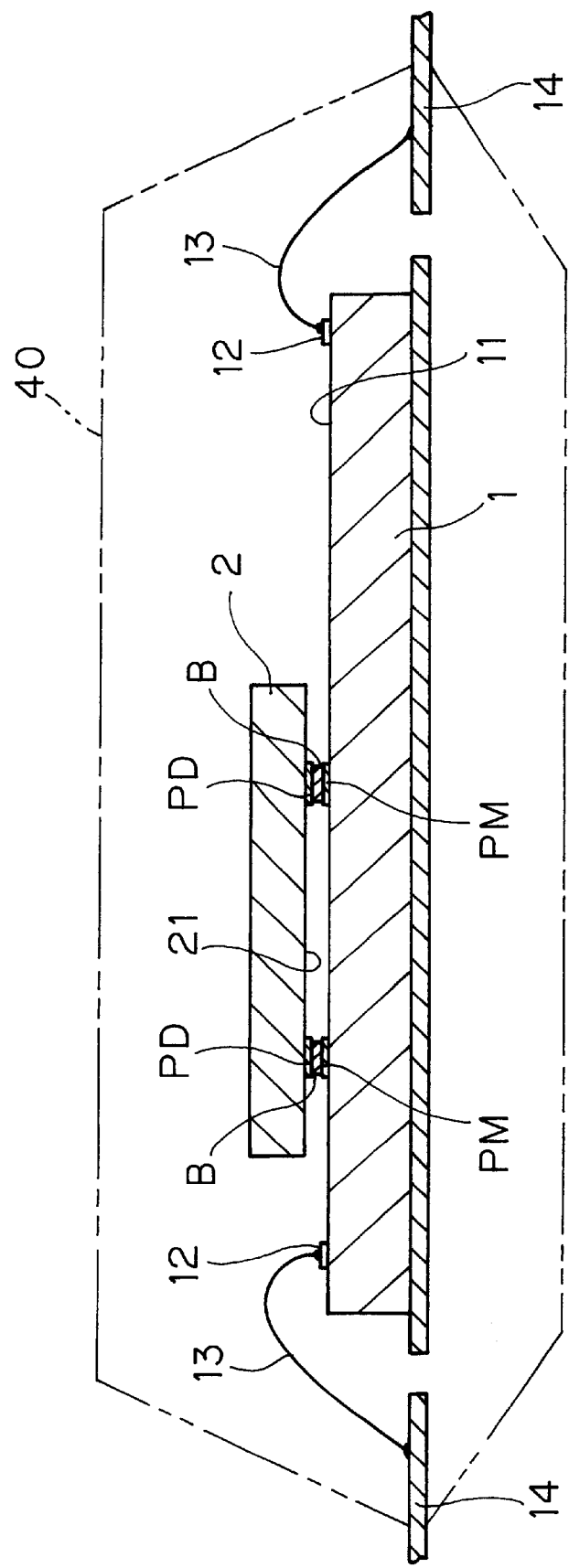
FIG. 2 is a sectional view of the multichip semiconductor device shown in FIG. 1.

First, with reference to FIGS. 1 to 3, the multichip semiconductor device of a first embodiment of the invention will be described. FIG. 1 is an exploded perspective view of the multichip semiconductor device of the first embodiment, and FIG. 2 is a sectional view of the multichip semiconductor device shown in FIG. 1. This semiconductor device has, as a first semiconductor chip, a mother chip 1, and has, as a second semiconductor chip, a daughter chip 2 superposed on and bonded to the surface 11 of the mother chip 1. Thus, this semiconductor device has a so-called chip-on-chip structure. This multichip semiconductor device having a chip-on-chip structure is enclosed in a package 40 by being molded in resin with lead frames 14 projecting outward for external connection.

The mother chip 1 is formed out of, for example, a silicon chip, and has a field-programmable gate array (FPGA) circuit formed therein. The surface 11 of this mother chip 1, i.e. that side of the semiconductor substrate constituting the base of the mother chip 1 on which an active surface-layer region lies in which functional devices such as transistors are formed, is covered with an insulating protective film as the topmost layer. Above this protective film, a plurality of pads 12 for external connection are arranged so as to be exposed in predetermined positions near the edge of the substantially rectangular and flat surface 11 of the mother chip 1. These external connection pads 12 are connected to the lead frames 14 by way of bonding wires 13.

In an inner region on the mother chip 1, a bonding region 15 is provided so as to allow the daughter chip 2 to be bonded thereto. In this bonding region 15, a plurality of chip connection pads PM (of which only eight are shown in FIG. 1) are arranged for achieving chip-to-chip connection with the daughter chip 2.

The daughter chip 2 is formed out of, for example, a silicon chip, and has a non-volatile memory circuit (hereinafter referred to as the "non-volatile configuration memory circuit") formed therein that is composed of EPROM (erasable programmable read-only memory) or the like and that is used to set the states of the switches of the FPGA. The surface 21 of this daughter chip 2, i.e. that side of the semiconductor substrate constituting the base of the daughter chip 2 on which an active surface-layer region lies in which functional devices such as transistors are formed, is covered with an insulating protective film as the topmost layer. Above this protective film, a plurality of chip connection pads PD (of which only eight are shown in FIG. 1) are formed for achieving chip-to-chip connection with the mother chip 1.

On these chip connection pads PD of the daughter chip 2, bumps B are formed individually that are made of an oxidation-resistant metal such as gold, lead, platinum, silver, or iridium. These bumps B constitute protruding metal electrodes that serve as chip-to-chip connection members.

The daughter chip 2 is bonded to the mother chip 1 with the surface 21 of the former facing the surface 11 of the latter. This bonding is achieved by pressing the mother and daughter chips 1 and 2 onto each other until they are bonded together with the bumps B kept individually in contact with the chip connection pads PM formed in the bonding region 15. During this bonding, supersonic vibration is applied, as required, to the mother chip 1 and/or the daughter chip 2 to achieve secure bonding between the bumps B and the chip connection pads PM.

Figure 3:
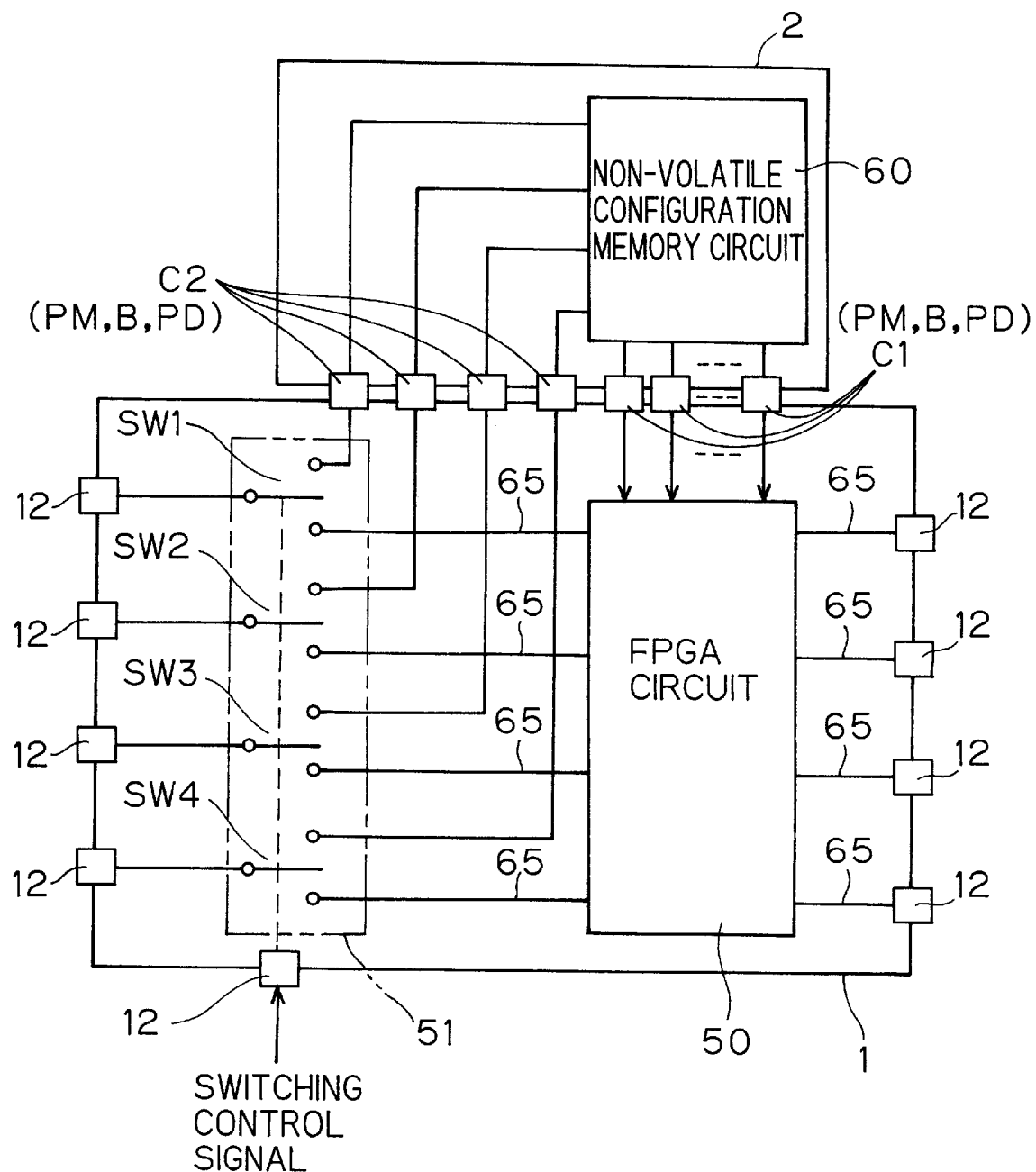
FIG. 3 is a block diagram showing the electrical configuration of the multichip semiconductor device shown in FIG. 1.

FIG. 3 is a block diagram showing the electrical configuration of the multichip semiconductor device described above. The mother chip 1 has an FPGA circuit 50 (programmable gate array) and a switch circuit 51 formed therein as its internal circuits, and thus constitutes an FPGA chip as a whole. The daughter chip 2 has a non-volatile configuration memory circuit 60 (hereinafter referred to as the "configuration memory circuit") formed therein as its internal circuit, and thus constitutes a configuration memory chip as a whole.

When the mother chip 1 and the daughter chip 2 are bonded together, the configuration memory circuit 60 is connected, by way of the chip-to-chip connection members C1 formed by predetermined ones of the chip connection pads PM and PD and the bumps B, to the FPGA circuit 50. The internal switches of the FPGA circuit 50 are switched in accordance with the setting information stored in the configuration memory circuit 60. Accordingly, by writing to the configuration memory circuit 60 the setting information that corresponds to a desired circuit, the FPGA circuit 50 forms a circuit having the desired configuration.

The input/output lines 65 of the FPGA circuit 50 are connected to the external connection pads 12. Part of the input/output lines 65 are connected through the switch circuit 51 to the external connection pads 12. The switch circuit 51 is thus, on the one hand, connected to the input/output lines 65, and in addition, on the other hand, connected, by way of the chip-to-chip connection members C2 formed by predetermined ones of the chip connection pads PM and PD and the bumps B, to the configuration memory circuit 60.

The switch circuit 51 has switches SW1, SW2, . . . provided one for each of the chip connection members C2.

The switches SW1, SW2, . . . can be switched individually between a state in which they connect their respective external connection pads 12 to the corresponding input/output lines 65 and a state in which they connect their respective external connection pads 12 to the corresponding chip-to-chip connection members C2. The external connection pads 12 connected to the switches SW1, SW2, . . . and the lead frames 14 connected thereto are used as external connection terminals that serve, at one time, as programming terminals for programming the configuration memory circuit 60 and, at another time, as input/output terminals for achieving input/output to and from the FPGA circuit 50. The switches SW1, SW2, . . . are switched individually between the two states described above in accordance with a switch control signal fed in via a predetermined one of the external connection pad 12.

In actual use of this semiconductor device, first, a switch control signal is fed in so that the switches SW1, SW2, . . . of the switch circuit 51 are switched to the states in which they are connected to the configuration memory circuit 60. In this condition, via the external connection pads 12 connected to the switch circuit 51, the setting information about how to set the circuit of the FPGA circuit 50 is written to the configuration memory circuit 60. After completion of the writing of the setting information, the switch control signal is so changed that the switches SW1, SW2, . . . are switched to the states in which they are connected to the input/output lines 65 of the FPGA circuit 50 (for example, by making the external connection pad 12 for receiving the switch control signal open). Now, the external connection pads 12 connected to the switch circuit 51 can be used to allow input/output to and from the FPGA circuit 50.

On completion of the writing of the setting information to the configuration memory circuit 60, the FPGA circuit 50 forms the circuit corresponding to the setting information. Thereafter, since the configuration memory circuit 60 stores the setting information on a non-volatile basis, even if the supply of electric power to the semiconductor device is once cut off, the FPGA circuit 50 forms the desired circuit as soon as the semiconductor device starts being used again.

As described above, in this embodiment, a mother chip 1 having an FPGA circuit 50 formed therein and a daughter chip 2 having a configuration memory circuit 60 formed therein are bonded together so as to form a multichip semiconductor device having a chip-on-chip structure that can be handled practically as a single chip. This makes it possible to form a desired circuit without the need to connect EPROM externally for storing setting information, and thus helps reduce the number of external connection terminals required. Put it in another way, almost all of the external connection terminals available can be used to achieve input/output to and from the FPGA circuit 50, and thus it is possible to alleviate the limit on the number of input/output signals allowed into and out of it.

Moreover, since there is no need to connect EPROM externally, it is possible to realize an FPGA having substantially the same shape as an ASIC (application-specific integrated circuit) manufactured by a masking process; that is, it is possible to greatly reduce the area occupied by an FPGA, and thereby make the FPGA readily substitutable for an ASIC manufactured by a masking process.

Moreover, the chip-on-chip structure helps greatly shorten the length of the conductors between the chips. This makes the semiconductor device insusceptible to external noise, and permits it to operate at high speed.

Furthermore, in the structure of this embodiment, part of the external connection pads 12 are used both to program the configuration memory circuit 60 and to achieve input/output to and from the FPGA circuit 50. This also helps reduce the number of external connection terminals required and thereby alleviate the limit on the number of input/output signals allowed into and out of the FPGA circuit 50.

<Second Embodiment>

Figure 4:
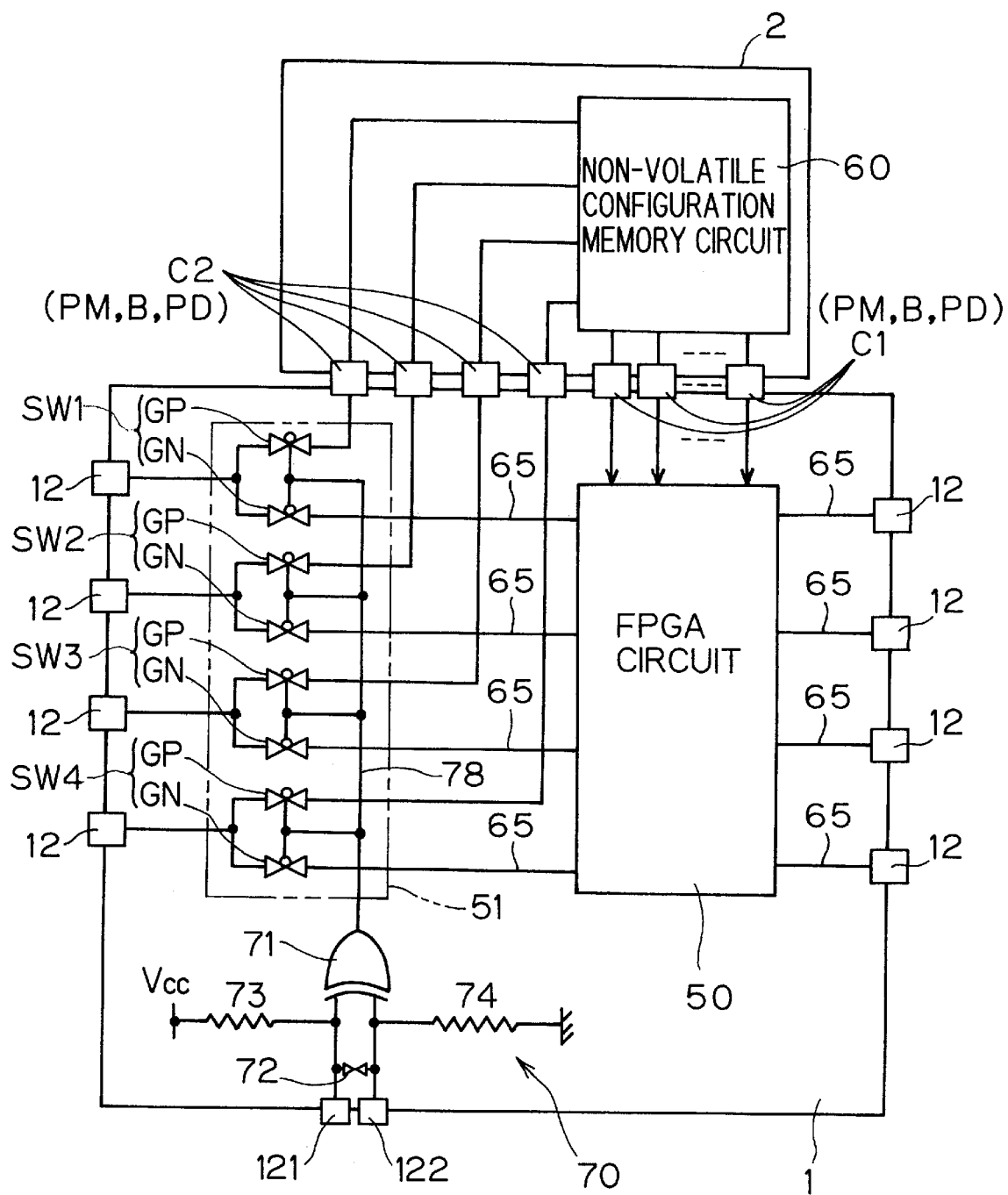
FIG. 4 is a block diagram showing the electrical configuration of the multichip semiconductor device of a second embodiment of the invention.
Figure 5:
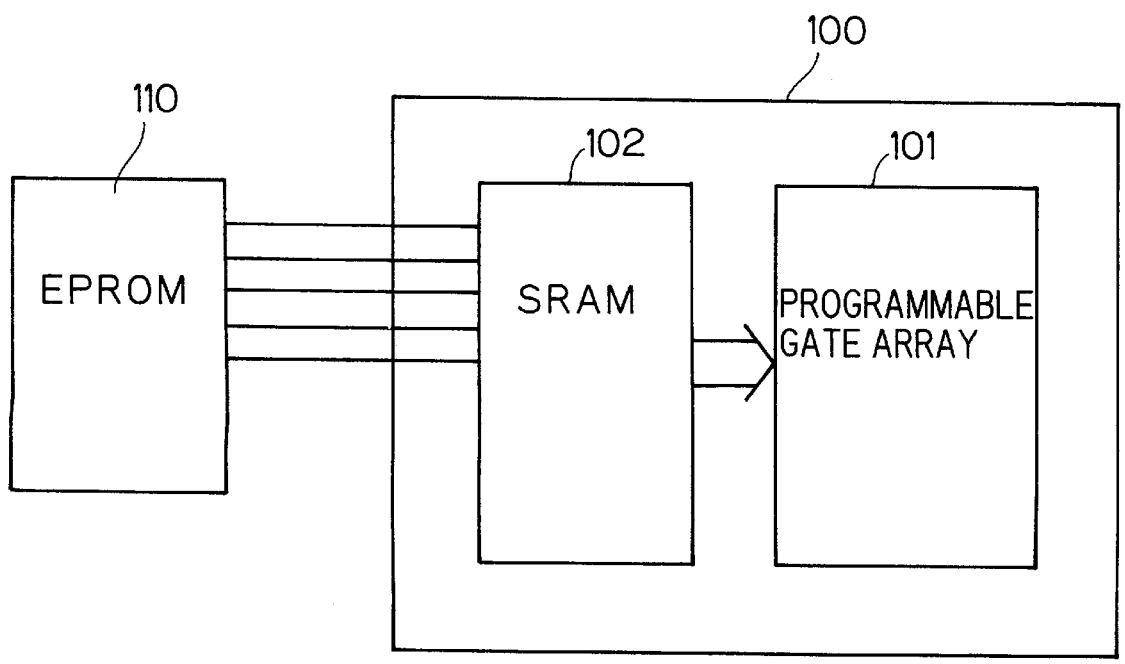
FIG. 5 is a block diagram showing the configuration of a conventional field-programmable gate array.

Next, with reference to FIG. 4, the multichip semiconductor device of a second embodiment of the invention will be described. FIG. 4 is a block diagram showing the electrical configuration of the multichip semiconductor device of the second embodiment. The configuration of this semiconductor device is very similar to that of the semiconductor device of the first embodiment described above, and therefore, in FIG. 4, such elements as are found also in FIG. 3 described previously are identified with the same reference numerals and symbols, and FIGS. 1 and 2 described already will also be referred to.

In this embodiment, a setting information protecting mechanism 70 is additionally provided to prohibit access from the outside to the setting information written to the configuration memory circuit 60. In this embodiment, the setting information protecting mechanism 70 is composed of an exclusive OR gate 71 and an antifuse 72 connected between the two input terminals of the exclusive OR gate 71. The two input terminals of the exclusive OR gate 71 are connected respectively to predetermined two 121 and 122 of the external connection pads 12. A supplied voltage Vcc is fed through a resistor 73 to the input terminal of the exclusive OR gate 71 that is connected to the pad 121, and a ground potential is fed through a resistor 74 to the input terminal of the exclusive OR gate 71 that is connected to the pad 122.

The switch circuit 51 is composed of switches SW1, SW2, ..., which are each composed of a pair of a positive-logic (high-active) gate GP (which conducts, for example, when a high level is applied to the gate of an n-channel MOS transistor it incorporates) and a negative-logic (low-active) gate GN (which conducts, for example, when the n-channel MOS transistor of the positive-logic gate GP is in a non-conducting state). One of the two output terminals of the positive-logic gate GP is connected by way of one of the chip-to-chip connection members C2 to the configuration memory circuit 60. One of the two output terminals of the negative-logic gate GN is connected by way of one of the input/output lines 65 to the FPGA 50. The other output terminal of the positive-logic gate GP and the other output terminal of the negative-logic gate GN are together connected to one of the external connection pads 12.

To the control input terminals of the positive-logic gate GP and the negative-logic gate GN, the output signal of the exclusive OR gate 71 is fed, as a switch control signal, by way of a switch control line 78.

When the setting information about how to set the circuit of the FPGA circuit 50 is written to the configuration memory circuit 60, the pads 121 and 122 connected to the two input terminals of the exclusive OR gate 71 are both left open. Moreover, initially, the antifuse 72 is in a cut-off state. Accordingly, the exclusive OR gate 71 receives, at one input terminal, the supplied voltage Vcc and, at the other input terminal, the ground potential. This causes the exclusive OR gate 71 to output a high level. As a result, the positive-logic gate GP is kept in a conducting state, and the negative-logic gate GN is kept in a cut-off state. Accordingly, in this condition, it is possible to program the configuration memory circuit 60 via the external connection pads 12 connected to the switch circuit 51.

On the other hand, after completion of the programming of the configuration memory circuit 60, an appropriate voltage is applied between the pads 121 and 122. This causes the antifuse 72 to short-circuit the two input terminals of the exclusive OR gate 71, and this state is maintained permanently even after the voltage stops being applied between the pads 121 and 122. Accordingly, thereafter, the exclusive OR gate 71 outputs a low level irrespective of whether a voltage is applied between the pads 121 and 122 or not. As a result, the negative-logic gate GN is kept in a conducting state, and the positive-logic gate GP is kept in a cut-off state. Hereafter, the positive-logic gate GP is never brought into a conducting state.

Accordingly, via the external connection pads 12 connected to the switch circuit 51, access is permitted only to the FPGA circuit 50; that is, no access is permitted any longer to the configuration memory circuit 60. This prevents the contents of the configuration memory circuit 60 from being read out, and thereby ensures the secrecy of the setting information stored in the configuration memory circuit 60.

The present invention can be carried out in any other way than it is carried out in the two embodiments described above. For example, although the above-described embodiments deal with cases in which the programming of the configuration memory circuit 60 is achieved only via the external connection pads 12 connected to the switch circuit 51, it is also possible to connect part of the conductors used to program the configuration memory circuit 60 directly to external connection pads 12 dedicated thereto without passing through the switch circuit 51.

Moreover, although the above-described embodiments deal with cases in which bumps B are formed on the daughter chip 2, it is also possible to form similar bumps on the mother chip 1, or form bumps on both the mother and daughter chips 1 and 2 so that chip-on-chip bonding between the mother and daughter chips 1 and 2 will be achieved by bonding the bumps together.

Moreover, since the protruding metal electrodes for connecting the mother and daughter chips 1 and 2 together do not need to have an appreciable height, they may be formed as vapor-deposited metal films or the like instead of bumps such as are generally formed by electrolytic or electroless plating.

Furthermore, although the above-described embodiments deal with multichip semiconductor devices having a chip-on-chip structure in which a mother chip 1 and a daughter chip 2 are bonded together through bumps B, the present invention is applicable also to semiconductor devices having a chip-on-chip structure in which a mother chip 1 and a daughter chip 2 are bonded together with the bottom surface (i.e. the surface opposite to the active surface-layer region) of the daughter chip 2 kept in contact with the top surface of the mother chip 1 and in which their chip connection pads are connected together by wire bonding. In cases where chips are connected together by wire bonding, it is not always necessary to adopt a chip-on-chip structure. Furthermore, the present invention is applicable even to semiconductor devices in which a plurality of semiconductor chips are bonded on a circuit board having a wiring pattern formed thereon and in which the semiconductor chips are connected together by the wiring pattern formed on the circuit board.

Furthermore, although the above-described embodiments deal with cases in which both the mother chip 1 and the daughter chip 2 are made of silicon, it is possible to use semiconductor chips made of any other material than silicon, such as compound semiconductor (gallium-arsenide) or germanium, in semiconductor devices embodying the present invention. The first and second semiconductor chips may be made of either identical or different materials.

Obviously, many modifications and variations of the present invention are possible in light of the above teachings. It is therefore to be understood that within the scope of the appended claims, the invention may be practiced other than as specifically described.

What is claimed is:

1. A multichip semiconductor device, comprising:

a first semiconductor chip having a field-programmable gate array circuit portion;

a second semiconductor chip having a programmable non-volatile memory for storing setting information about how to set a circuit of the field-programmable gate array circuit portion;

an external connection terminal formed on the first semiconductor chip;

a switch circuit formed on the first semiconductor chip and connected to the external connection terminal;

an input/output line for connecting the switch circuit and the field-programmable gate array circuit portion to each other;

a first connecting member for connecting the field-programmable gate array circuit portion and the non-volatile memory to each other;

a second connecting member for connecting the switch circuit and the non-volatile memory to each other; and a setting information protecting mechanism for switching the switch circuit to the second state so as to disconnect the external connection terminal from the non-volatile memory permanently after the setting information has been stored in the non-volatile memory by being fed thereto from the external connection terminal through the switch circuit and the second connecting member, wherein the switch circuit can be switched between a first state connected to the second connecting member and a second state connected to the field-programmable gate array circuit portion, and the setting information about how to set the circuit of the field-programmable gate array circuit portion is written to the non-volatile memory by way of the second connecting member when the switch circuit is in the first state.

2. A multichip semiconductor device as claimed in claim 1, wherein the first and second semiconductor chips are bonded together by superposing the second semiconductor chip on and bonding it to a surface of the first semiconductor chip so as to form a chip-on-chip structure as a whole.

* * * * *